US012648312B2

(12) United States Patent
Li et al.

(10) Patent No.: US 12,648,312 B2
(45) Date of Patent: Jun. 2, 2026

(54) DISPLAY PANEL, DRIVE ASSEMBLY, AND DISPLAY DEVICE WITH PAD AREAS PROGRESSIVELY DECREASING TOWARDS DISPLAY REGION

(71) Applicants: Chengdu BOE Optoelectronics Technology Co., Ltd., Chengdu (CN); BOE Technology Group Co., Ltd., Beijing (CN)

(72) Inventors: Shaopeng Li, Beijing (CN); Jianhua Shu, Beijing (CN); Weiben Zhang, Beijing (CN); Peng Wang, Beijing (CN); Rongkun Fan, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 614 days.

(21) Appl. No.: 18/022,514

(22) PCT Filed: Mar. 31, 2022

(86) PCT No.: PCT/CN2022/084555
§ 371 (c)(1),
(2) Date: Feb. 22, 2023

(87) PCT Pub. No.: WO2023/184396
PCT Pub. Date: Oct. 5, 2023

(65) Prior Publication Data
US 2024/0292680 A1    Aug. 29, 2024

(51) Int. Cl.
*H10K 59/131*        (2023.01)

(52) U.S. Cl.
CPC .................................. *H10K 59/131* (2023.02)

(58) Field of Classification Search
CPC ..................................................... H10K 59/131
See application file for complete search history.

(56) References Cited

U.S. PATENT DOCUMENTS

| | | | | |
|---|---|---|---|---|
| 9,960,132 | B1 * | 5/2018 | Chen | H10D 86/411 |
| 10,242,605 | B2 * | 3/2019 | Chen | H01L 23/544 |

(Continued)

FOREIGN PATENT DOCUMENTS

| | | |
|---|---|---|
| CN | 205376002 U | 7/2016 |
| CN | 107621710 A | 1/2018 |

(Continued)

*Primary Examiner* — Lex H Malsawma
(74) *Attorney, Agent, or Firm* — XSENSUS LLP

(57) ABSTRACT

Provided is a display panel. The display panel has a display region and a non-display region disposed outside the display region, and includes: a first substrate; a plurality of light emitting elements disposed within the display region; and a plurality of first pads disposed within the non-display region, wherein the plurality of first pads are configured to be electrically connected to the plurality of light emitting elements and electrically connected to a driver assembly, the plurality of first pads are arrayed in a plurality of rows, and the plurality of rows of the first pads are sequentially arranged along a direction departing from the display region; wherein areas of orthographic projections of the rows of the first pads on the first substrate progressively decrease in a direction approaching the display region.

18 Claims, 11 Drawing Sheets

(56)        References Cited

U.S. PATENT DOCUMENTS

| | | | | |
|---|---|---|---|---|
| 2005/0127493 A1* | 6/2005 | Yuzawa | ........... H01L 23/49838 | |
| | | | | 257/691 |
| 2007/0029658 A1* | 2/2007 | Peng | ................. G02F 1/13452 | |
| | | | | 257/680 |
| 2018/0020550 A1* | 1/2018 | Jang | ....................... H05K 1/118 | |
| 2018/0040576 A1* | 2/2018 | Kim | ....................... H01L 24/06 | |
| 2019/0058028 A1* | 2/2019 | Won | .................... H10K 59/131 | |
| 2019/0148327 A1 | 5/2019 | Chen et al. | | |
| 2022/0093717 A1* | 3/2022 | Kim | ................... G02F 1/13458 | |
| 2022/0320460 A1 | 10/2022 | Rao | | |

FOREIGN PATENT DOCUMENTS

| | | | | |
|---|---|---|---|---|
| CN | 109523912 A | 3/2019 | | |
| CN | 110288913 A | 9/2019 | | |
| CN | 111326556 A | 6/2020 | | |
| CN | 112420789 A | 2/2021 | | |
| CN | 113299218 A | 8/2021 | | |
| CN | 113421494 A | 9/2021 | | |
| EP | 1408364 A1 * | 4/2004 | ............ H01L 24/12 | |

\* cited by examiner

A-A'

1

DISPLAY PANEL, DRIVE ASSEMBLY, AND DISPLAY DEVICE WITH PAD AREAS PROGRESSIVELY DECREASING TOWARDS DISPLAY REGION

CROSS-REFERENCE TO RELATED APPLICATION

This application is a U.S. national phase application based on PCT/CN2022/084555, filed on Mar. 31, 2022, the disclosure of which is incorporated herein by reference in its entirety.

TECHNICAL FIELD

The present disclosure relates to the field of display technology and, in particular, relates to a display panel, a drive assembly, and a display device.

BACKGROUND OF THE INVENTION

With the development of display technology, the display devices are used more and more widely. Commonly used display devices include smartphones, tablet computers, televisions and monitors.

SUMMARY OF THE INVENTION

Embodiments of the present application provide a display panel, a drive assembly and a display device to solve the problem of poor display effect of the display panel of the prior art. The technical solutions are as follows.

According to some embodiments of the present disclosure, a display panel is provided. The display panel has a display region and a non-display region disposed outside the display region, and includes:

a first substrate;

a plurality of light emitting elements disposed within the display region; and a plurality of first pads disposed within the non-display region, wherein the plurality of first pads are configured to be electrically connected to the plurality of light emitting elements and electrically connected to a driver assembly, the plurality of first pads are arrayed in a plurality of rows, and the plurality of rows of the first pads are sequentially arranged along a direction departing from the display region;

wherein areas of orthographic projections of the rows of the first pads on the first substrate progressively decrease in a direction approaching the display region.

In some embodiments, the plurality of first pads are arrayed in a plurality of rows in a first direction and in a plurality of columns in a second direction;

wherein widths in the first direction and/or in the second direction of the first pads in one column progressively decrease in a direction approaching the display region.

In some embodiments, widths of the first pads in different rows in the first direction are equal, and distances between two adjacent rows of the first pads are equal; and widths in the second direction of the first pads in one column progressively decrease in the direction approaching the display region, and distances between two adjacent first pads in each of the rows progressively increase in the direction approaching the display region.

2

In some embodiments, widths of the first pads in different rows in the second direction are equal, and distances between two adjacent first pads in each of the rows are equal; and widths in the first direction of the firsts pad in one column progressively decrease in the direction approaching the display region, and distances between two adjacent rows of the first pads progressively increase in the direction approaching the display region.

In some embodiments, widths in the first direction and the second direction of each of the first pads in one column progressively decrease in the direction approaching the display region, distances between two adjacent first pads in each of the rows progressively increase in the direction approaching the display region, and distances between two adjacent rows of the first pads progressively increase in the direction approaching the display region.

In some embodiments, widths of the first pads in different rows in the second direction are equal, and distances between two adjacent first pads in each of the rows are equal, and distances between two adjacent rows of the first pads are equal; and widths in the first direction of the firsts pad in one column progressively decrease in the direction approaching the display region.

In some embodiments, distances between two adjacent rows of the first pads are equal; and widths in the first direction and the second direction of each of the first pads in one column progressively decrease in the direction approaching the display region; distances between two adjacent first pads in each of the rows progressively increase in the direction approaching the display region.

In some embodiments, for two adjacent first pads of the first pads in one column, a width in the first direction of the first pad closer to the display region is 5% to 10% less than a width in the first direction of the other first pad.

In some embodiments, for two adjacent first pads of the first pads in one column, a width in the second direction of the first pad closer to the display region is 5% to 10% less than a width in the second direction of the other first pad.

In some embodiments, the first pad has a plurality of corners, the corners including at least one of rounded corners and chamfered corners.

In some embodiments, in response the corner being the rounded corner, a radius of the rounded corner ranges from 10% to 50% of a width of the first pad in the first direction.

In some embodiments, in response the corner being the chamfered corner, an angle between a bevel of the chamfered corner and the second direction ranges from 15° to 45°, and a width in the second direction of the chamfered corner ranges from 10% to 20% of the width in the second direction of the first pad.

In some embodiments, in response to the corners including the rounded corner and the chamfered corner, an angle between a bevel of the chamfered corner and the second direction ranges from 15° to 45°, and a width in the second direction of the chamfered corner ranges from 10% to 20% of a width in the second direction of the first pad; and a radius of the rounded corner ranges from 10% to 50% of a target width, the target width being a difference between the width in the second direction of the first pad and a width in the second direction of the two chamfered corners.

In some embodiments, the plurality of first pads are arrayed in at least 4 rows.

In some embodiments, the areas of orthographic projections of the first pads in one row on the first substrate are equal, and distances between two adjacent first pads in one row are equal.

According to some embodiments of the present disclosure, a drive assembly is provided. The drive assembly has a member region and a connection region disposed on one side of the member region, and includes:

a second substrate.

a driver chip disposed within the member region.

a plurality of second pads within the connection region, wherein the plurality of second pads are configured to be electrically connected to the driver chip and electrically connected to a display panel, the plurality of second pads are arrayed in a plurality of rows, and the plurality of rows of the second pads are sequentially arranged along a direction departing from the member region;

wherein areas of orthographic projections of the rows of the second pads on the second substrate progressively decrease in a direction departing from the member region.

According to some embodiments of the present disclosure, a display device is provided, including: the above any of display panel and a drive assembly, wherein the plurality of first pads in the display panel are one to one electrically connected to a plurality of second pads in the drive assembly.

BRIEF DESCRIPTION OF DRAWINGS

In order to describe the technical solutions in the embodiments of the present disclosure more clearly, the following briefly describes the accompanying drawings required for describing the embodiments. Apparently, the accompanying drawings in the following description show merely some embodiments of the present disclosure, and those of ordinary skill in the art can still derive other drawings from these accompanying drawings without creative efforts.

DETAILED DESCRIPTION

For clearer descriptions of the objectives, technical solutions, and advantages of the present disclosure, the following further describes implementations of the present disclosure in detail with reference to the accompanying drawings.

Display devices usually include a display panel and a flexible circuit board. The display panel has a display region and a non-display region. The display panel includes: a plurality of light-emitting elements disposed in the display region, and a plurality of first pads disposed in the non-display region. The plurality of first pads are electrically connected to the light-emitting elements through signal lines. The flexible circuit board has a plurality of second pads, and the flexible circuit board is bound in the display panel behind the non-display region, the plurality of second pads of the flexible circuit board are one to one electrically connected to the plurality of first pads. The flexible circuit board is usually bound to the display panel by an anisotropic conductive adhesive film (ACF). In this way, the flexible circuit board controls the light-emitting elements in the display region of the display panel, such that the display panel can display the corresponding screen.

However, in the case that the flexible circuit board is bound to the non-display region of the display panel, the electrical connection between the plurality of first pads of the display panel and the plurality of second pads of the flexible circuit board through the ACF is poor, resulting in a poor display of the display panel.

Figure 1:
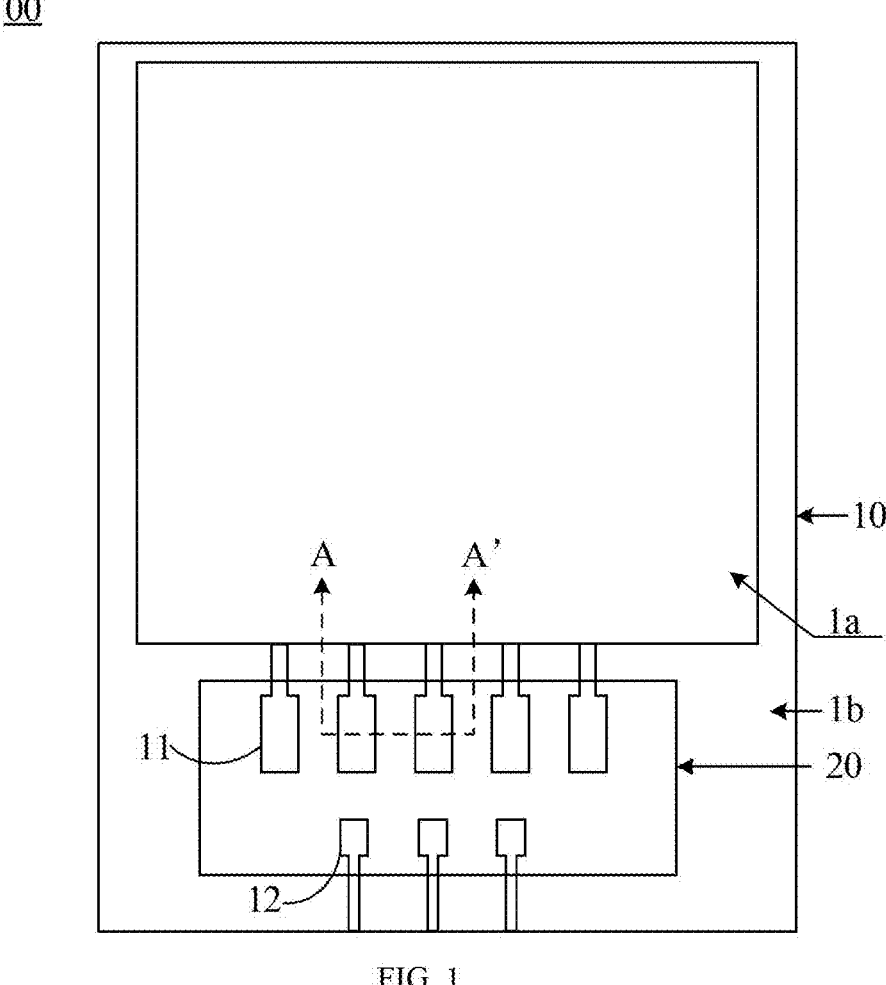
FIG. 1 is a top view of a display device according to the related art.
Figure 2:
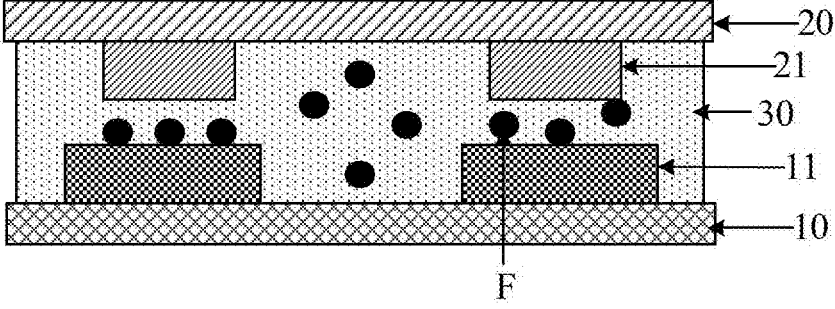
FIG. 2 is a schematic cross-sectional view of the display device at A-A' illustrated in FIG. 1.

In the related art, referring to FIG. 1 and FIG. 2, FIG. 1 is a top view of a display device according to the related art, and FIG. 2 is a schematic cross-sectional view of the display device at A-A' illustrated in FIG. 1. The display device 00 typically includes: a display panel 10, a flexible circuit board 20, and an ACF 30 disposed between the display panel 10 and the flexible circuit board 20. The display panel 10 has a display region 1a, and a non-display region 1b disposed outside the display region 1a. The flexible circuit board 20 is bound within the non-display region 1b of the display panel 00 by the ACF 30. The area of the orthographic projection of the ACF 30 on the display panel 10 is typically the binding region.

The display panel 10 includes: a plurality of light emitting elements (not shown in the figure) disposed within the display region, and a plurality of first pads 11 disposed within the non-display region 1b, and the plurality of first pads 11 are electrically connected to the light emitting elements via signal lines. The plurality of first pads 11 are disposed within the binding region of the non-display region 1b.

The flexible circuit board 20 has a plurality of second pads 21, and the plurality of second pads 21 of flexible circuit board 20 are one to one electrically connected to the plurality of first pads 11. In this way, the flexible circuit board 20 can apply electrical signals to the display panel 10 through the electrically connected second pads 21 and first pads 11 to control the light emitting elements in the display panel 10, which enables the display panel 10 to display the corresponding screen.

The second pads of the flexible circuit board 20 and the corresponding first pads 11 of the display panel 10 are electrically connected by ACF 30. In the process of binding the flexible circuit board to the display panel 10 by the ACF, pressure needs to be applied to the flexible circuit board 20, such that the film of the ACF 30 disposed between the second pad 21 and the first pad 11 is extruded and the second pad 21 and the first pad 11 are electrically connected to each other through the conductive particles F in the ACF. In this process, it is usually also necessary to heat, such that the excess film of the ACF 30 in the binding region can flow out of the region between the two adjacent first pads 11, thus ensuring that the second pads 21 and the first pads 11 are electrically connected through the conductive particles F better.

As shown in FIG. 1, a plurality of electrical pads 12 are also typically disposed in the non-display region 1b of the display panel 10. The plurality of electrical pads 12 are arranged in the direction of the plurality of first pads 11 departing from the display region 1a. In the case that the flexible circuit board is bound to the non-display region 1b of the display panel 10 by the ACF 30, the plurality of electrical pads 12 are electrically connected to the flexible circuit board 20 by the ACF 30, enabling the plurality of electrical pads 12 to be electrically connected to the power supply assembly by the flexible circuit board 20. In this way, in the case that the excess film of the ACF 30 is extruded into the region between the two adjacent first pads 11 during the process of binding the flexible circuit board to the display panel 10 by the ACF, the excess film flows mainly in the direction departing from the plurality of electrical pads 12 (i.e., flowing in the direction approaching the display region 1a) to flow out of the binding region.

However, in order to make the display panel 10 capable of high resolution, more signal lines need to be provided in the display panel 10, and each signal line is electrically connected to a first pad 11. This results in an increasing quantity of first pads 11 disposed in the non-display region of the display panel 10.

Figure 3:
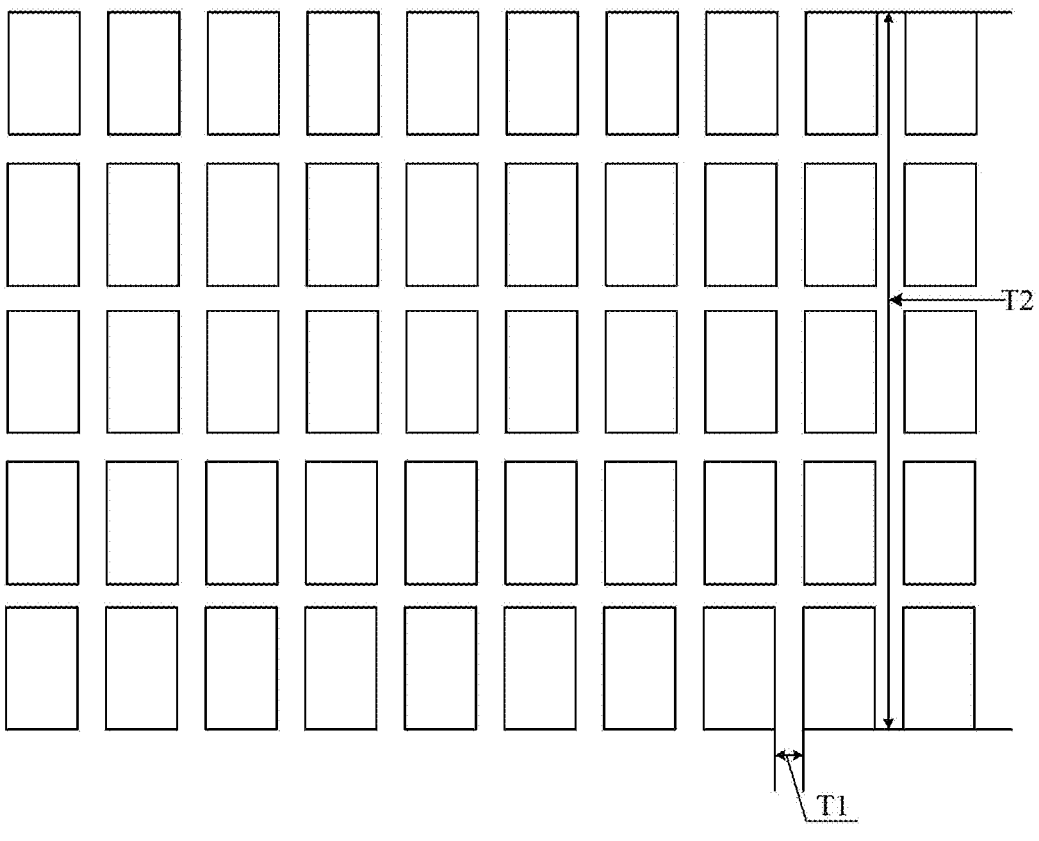
FIG. 3 is a schematic diagram of an arrangement of a first pad in a non-display region according to the related art.

In this way, referring to FIG. 3, which is a schematic diagram of an arrangement of a first pad in a non-display region according to the related art. The quantity of rows of first pads 11 disposed within the non-display region needs to be increased, and the quantity of first pads 11 in each row of first pads 11 also needs to be increased. In this way, the quantity of rows of first pads 11 disposed in the non-display region is higher, and the number of first pads 11 in each row of first pads 11 is also higher.

Because the excess film of the ACF 30 during the binding process needs to flow in the direction approaching the display region 1a, in the case that the quantity of rows of the first pads 11 disposed in the non-display region is large, the length T2 of the channel for the film to flow out of the binding region is larger. The channel for the film to flow out of the binding region indicates the region disposed between the two rows of first pads 11. The longer the length T2 of the channel for the film to flow out of the binding region is, the less likely the excess film of ACF 30 flows out of the channel. Therefore, in the case that the quantity of rows of first pads 11 disposed in the non-display region is high, it is difficult to discharge the film disposed between the second pads 21 and the first pads 11, which in turn seriously affects the electrical connection between the second pads 21 and the first pads 11 through the conductive particles F in the ACF.

In the case that the quantity of the first pads 11 in each row of first pads 11 is large, the width of any two adjacent first pads 11 is smaller and the channel width T1 for the film to flow out of the binding region is smaller. The smaller the width T1 of the channel for the film to flow out of the binding region is, the less likely the excess film of the ACF 30 flows out of the channel. Therefore, in the case that the quantity of the first pads 11 in each row of first pads 11 is high, the difficulty of discharging the film disposed between the second pads 21 and the first pads 11 is increased, further affecting the effect of electrical connection between the second pads 21 and the first pads 11 through the conductive particles F in the ACF.

In addition, in the case that the pressure is applied to the flexible circuit board 20, the temperature of the ACF 03 decreases to solidify the ACF 03 disposed between the flexible circuit board 20 and the display panel 10. In this way, the excess film disposed between the second pad 21 and the first pad 11 is solidified because the film does not flow out of the channel disposed between the second pad 21 and the first pad 11. In this way, the solidified film between the second pad 21 and the first pad 11 causes the conductive particles F between the second pad 21 and the first pad 11 to not be in close contact with the second pad 21 and the first pad 11, which in results in a poor connection between the second pad 21 and the first pad 11.

Figure 4:
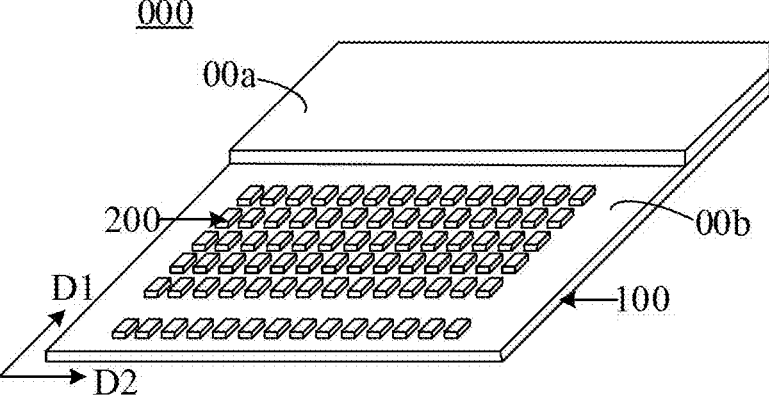
FIG. 4 is a schematic diagram of a three-dimensional structure of a display panel according to some embodiments of the present application.

Referring to FIG. 4, FIG. 4 is a schematic diagram of a three-dimensional structure of a display panel according to some embodiments of the present application. The display panel 000 has a display region 00a and a non-display region 00b disposed outside the display region 00a, which includes: a first substrate 100, light-emitting elements (not shown in the figure) disposed within the display region 00a, and a plurality of first pads 200 located within the non-display region 00b.

The plurality of first pads 200 are configured to be electrically connected to the plurality of light emitting elements and electrically connected to the drive assembly, the plurality of first pads 200 are arrayed in a plurality of rows, and the plurality of first pads 200 are sequentially arranged along a direction departing from the display region 00a. The drive assembly is a flexible circuit board, or a separate driver chip. In the case that the driver assembly is a flexible circuit board, the driver chip is integrated in the flexible circuit board. Exemplarily, the drive assembly includes a plurality of second pads one to one corresponding to the plurality of first pads 200, and the plurality of second pads are one to one electrically connected to the plurality of first pads 200 in the case that the drive assembly is bound to the display panel 000. It should be noted that the embodiment of present application is illustrated schematically only in the case that the drive assembly is a flexible circuit board.

Figure 5:
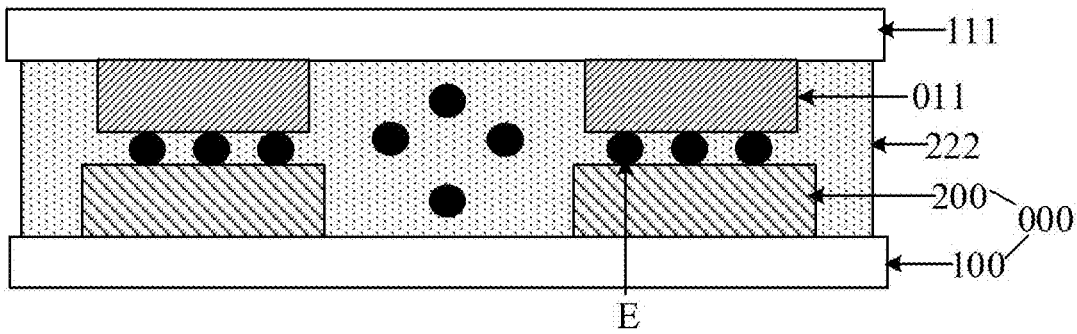
FIG. 5 is a schematic diagram of a cross-sectional view of a display panel bound with a drive assembly provided according to some embodiments of the present application.

In order to more clearly see the electrical connection between the drive assembly and the display panel 000. Referring to FIG. 5, FIG. 5 is a schematic cross-sectional view of a display panel bound with a drive assembly provided according to some embodiments of the present application. The second pads 011 of the driver assembly 111 are electrically connected to the first pads 200 of the display panel 000 by the ACF 222. In this way, during the process of binding the drive assembly 111 to the display panel 000, a pressing force is applied to the drive assembly 111, such that the excess film of the ACF 222 between each of the second pads 011 and the corresponding first pads 200 is extruded, and the second pads 011 are electrically connected to the first pads 200 through the conductive particles E in the ACF. In this way, the drive assembly 111 controls the light emitting elements within the display panel 000 to emit light through the one-to-one electrical connection between the plurality of second pads 011 and the plurality of first pads 200, which enables the display panel 000 to display the corresponding screen. The region where the drive assembly 111 is bound to the display panel 000 is usually the binding region, and the binding region is disposed in the non-display region 00b of the display panel 000.

In the embodiment of the present application, the display panel 000 further includes: a plurality of electrical pads 300 disposed within the non-display region 00b, and the plurality of electrical pads 300 are disposed on the side of the plurality of first pads 200 departing from the display region 00a. The plurality of electrical pads 300 are arranged in a row, and the electrical pads 300 are configured to supply power to the drive assembly 111 electrically connected thereto. In response to binding the drive assembly 111 to the non-display region 00b of the display panel 000 by the ACF 222, the plurality of electrical pads 300 also need to be electrically connected to the drive assembly 111 by the ACF 222, enabling the plurality of electrical pads 300 to be electrically connected to the power supply assembly by the drive assembly 111. Therefore, in the case that the excess film of the ACF 222 is extruded into the region between the two adjacent first pads 200 during the process of binding the drive assembly 111 to the display panel 000 by the ACF 222, the excess film flows mainly in a direction departing from the plurality of electrical pads 300 (i.e., flowing in a direction approaching the display region 00a) to flow out of the binding region.

Figure 6:
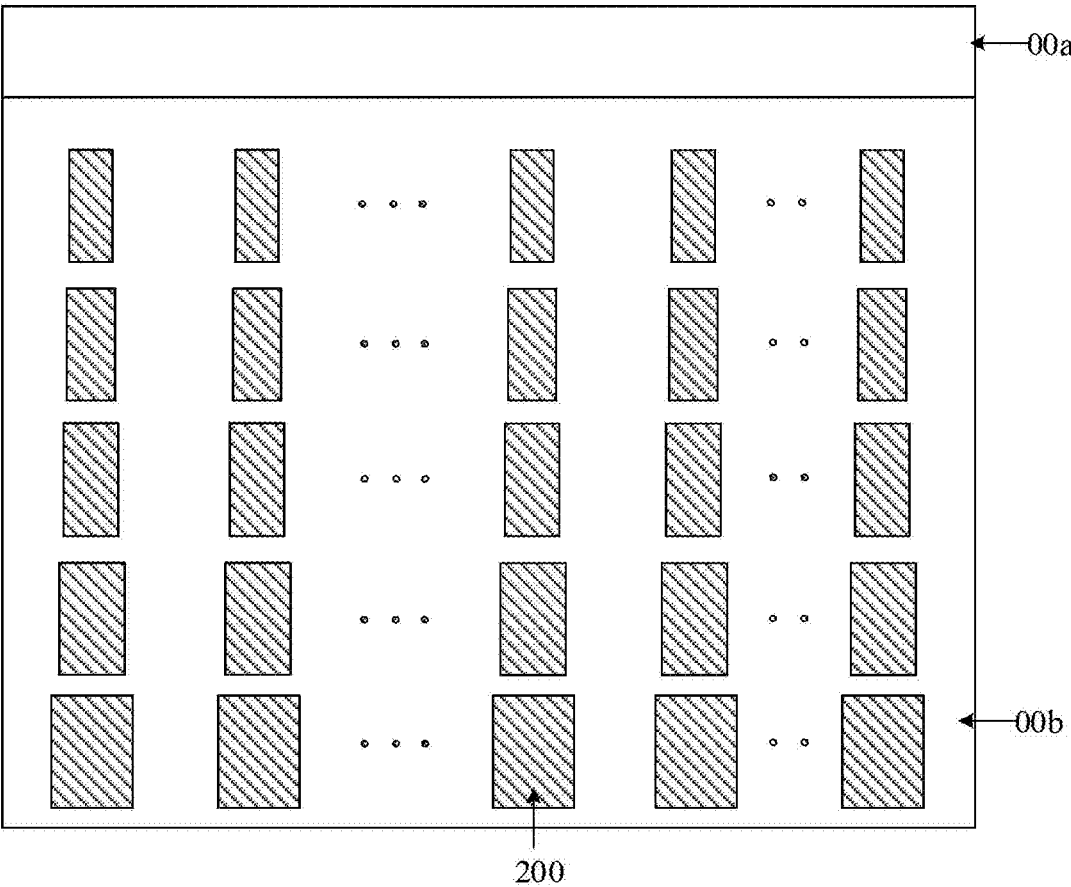
FIG. 6 is a schematic diagram of a first arrangement of first pads according to some embodiments of the present application.
Figure 7:
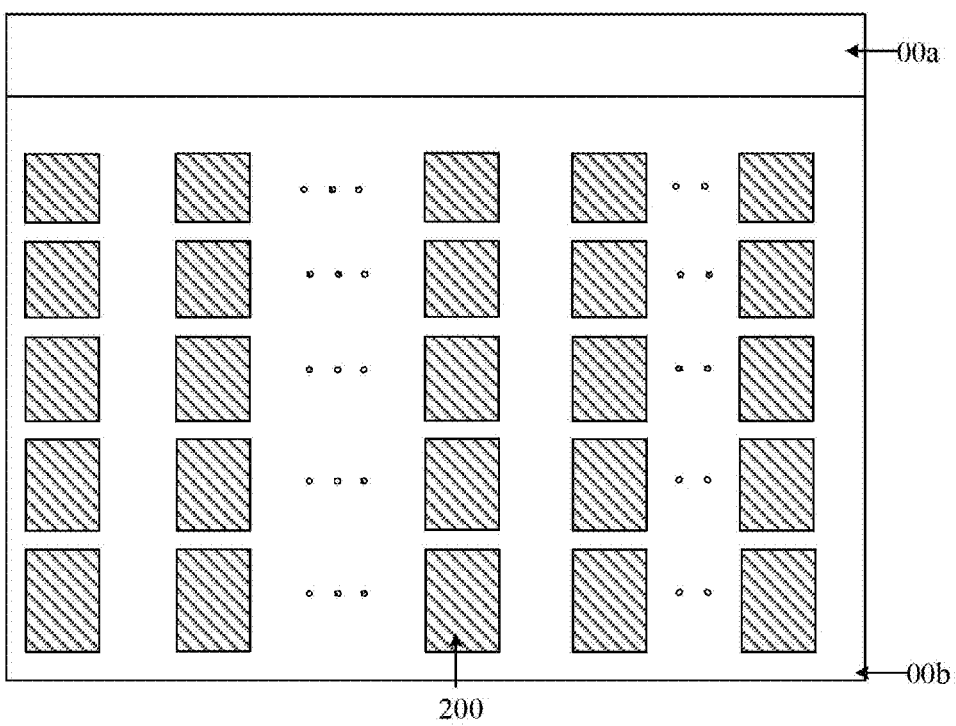
FIG. 7 is a schematic diagram of a layout of another first pads according to some embodiments of the present application.

In order to see the row of first pads 200 more clearly, referring to FIG. 6 and FIG. 7. FIG. 6 is a schematic diagram of an arrangement of first pads according to some embodiments of the present application, and FIG. 7 is a schematic diagram of another arrangement of first pads according to some embodiments of the present application. The area of the positive projection of each row of first pads 200 on the first substrate 100 progressively decrease along the direction approaching the display region 00a. The areas of the orthographic projections of the first pads 200 in one row on the first substrate 100 are equal, and the distances between two adjacent first pads 200 in one row are equal.

In some embodiments, as shown in FIG. 6, the area of the orthographic projection of the first pads 200 in one row on the first substrate 100 closer to the display region 00a is smaller, and the distance between any two adjacent first pads 200 in the row is larger. In this case, because the excess film of the ACF 222 disposed between the second pad 011 and the first pad 200 is extruded during the process of binding the drive assembly 111 to the display panel 000 by the ACF 222, this excess film flows in the direction closer to the display region 00a. Therefore, in the case that the distance between any two adjacent first pads 200 in a row closer to the display region 00a becomes larger, the excess film of the ACF 222 extruded from the first pads 200 and the second pads 011 flows faster in the direction approaching the display region 00a. In this way, the excess film between the second pads 011 and the first pads 200 does not accumulate in the binding region, such that the conductive particles E between the seconds pad 011 and the first pads 200 are in close contact with the second pads 011 and the first pads 200 respectively, which makes the electrical connection between the second pads 011 and the first pads 200 better.

In another embodiment, as shown in FIG. 7, the area of the positive projection of each of the first pads 200 on the first substrate 100 in the row closer to the display region 00a is smaller, and the distance between the first pads 200 in the row closest to the display region 00a and the first pads 200 in the row farthest from the display region 00a is smaller. In this case, in the case that the excess film of the ACF 222 between the second pads 011 and the first pads 200 is extruded during the process of binding the drive assembly 111 to the display panel 000 by the ACF 222, the excess film flows in the direction approaching the display region 00a. Therefore, in the case that the distance between the first pad 200 in the row closest to the display region 00a and the first pad 200 in the row farthest from the display region 00a is small, the excess film of the ACF 222 extruded from the first pad 200 and the second pad 011 flows in a direction closer to the display region 00a for a smaller distance, such that this excess film flows out of the binding region faster. In this way, the excess film between the second pads 011 and the first pads 200 does not accumulate in the binding region, such that the conductive particles E between the second pads 011 and the first pads 200 are in close contact with the second pads 011 and the first pads 200 respectively, which makes the electrical connection between the second pads 011 and the first pads 200 better.

In this way, although the quantity of first pads 200 disposed in the non-display region 00b is larger, it can ensure that the film extruded between the second pads 011 and the first pads 200 can more easily flows out of the binding region of the display panel 000, and does not affect the effect of the electrical connection between the second pads 011 and the first pads 200 through the conductive particles E, such that the display panel 000 has a better display effect.

In summary, the display panel provided by the embodiments of present application includes: a first substrate, light emitting elements and first pads. The areas of orthographic projections of each of the rows of the first pads on the first substrate progressively decrease in a direction approaching the display region, such that the distance between any two adjacent first pads in a row closer to the display region is larger, and/or, the distance between the row of the first closest to the display region and the roe of the first pads farthest from the display region is smaller. In the case that the excess film of the ACF between the second pads and the first pads is extruded in the process of binding the drive assembly to the display panel through the ACF, the excess film flows in the direction closer to the display region. In this way, in the case that the distance between any two adjacent first pads in a row arranged closer to the display region is greater, the excess film extruded from the ACF between the first pads and the second pads flows faster in the direction closer to the display region. Similarly, in the case that the distance between the row of the first pad closest to the display region and the row of the first pad farthest from the display region is smaller, the distance that the excess film of the ACF extruded from the first pad and the second pad flows in the direction closer to the display region is smaller, such that excess film can flow out of the binding region faster. In this way, the excess film between the second pads and the first pads does not accumulate in the binding region, such that the conductive particles between the second pads and the first pads are in close contact with the second pads and the first pads respectively, which makes the electrical connection between the second pads and the first pads better and effectively improves the display effect of the display panel.

In the embodiment of the present application, as shown in FIG. 4, the plurality of first pads 200 are arrayed in a plurality of rows along the first direction D1, and arrayed in a plurality of columns along the second direction D2. The first direction D1 and the second direction D2 are two directions perpendicular to each other.

The widths in the first direction D1 and/or in the second direction D2 of each of the first pads 200 in one column progressively decrease in a direction approaching the display region 00a. In this way, the area of the positive projection of the first pads 200 in one column on the first substrate 100 closer to the display region 00a is smaller. It should be noted that each of the first pads 200 in the rows are arrange in equal distances, such that the central axes of each of the first pads 200 in a row are coincident.

In the embodiment of present application, there are various optional ways of combining the width of the first pads 200 in the first direction D1 and the width in the second direction D2 in one column. Therefore, there are various optional ways to implement the arrangement of the plurality of first pads 200 in the display panel 000, and the present application embodiment is illustrated schematically with only the following five examples.

It should be noted that, in order to illustrate the arrangement way of the first pads 200 in the following embodiments, in the application, the width of the first pads 200 in the first direction D1 is K1, the distance between adjacent first pads 200 in the first direction D1 is K2, the width of the first pads 200 in the second direction D2 is K3, and the distance between adjacent first pads 200 in the second direction D2 is K4.

Figure 8:
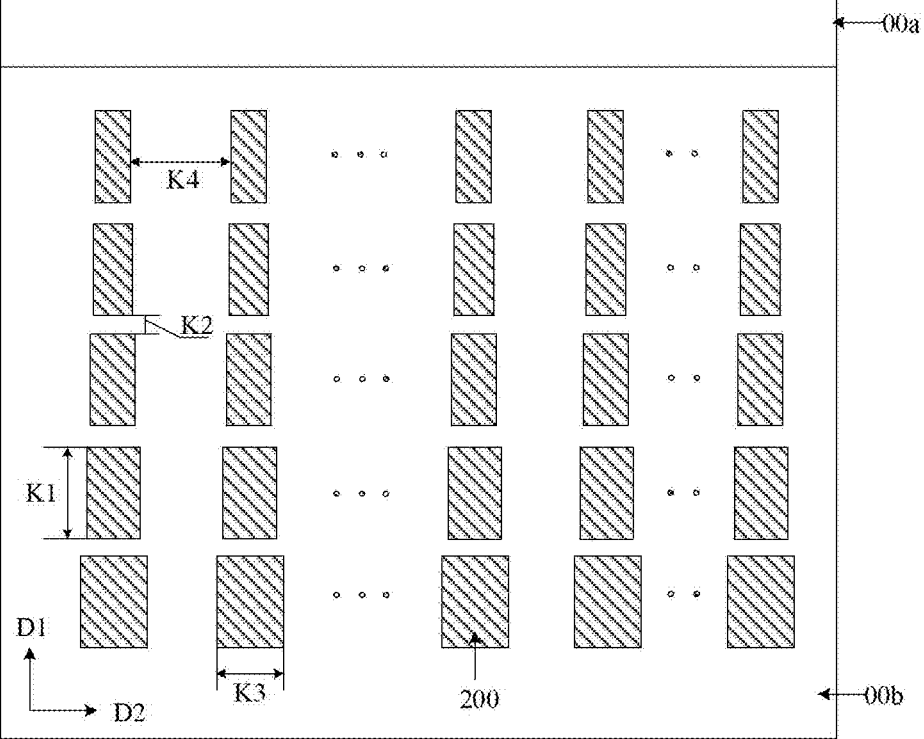
FIG. 8 is a schematic diagram of an arrangement of first pads according to some embodiments of the present application.

In the first optional implementation, referring to FIG. 8, FIG. 8 is the first arrangement of first pads according to some embodiments of the present application. The widths K1 of the first pads 200 in different rows in the first direction D1 are equal, and the distances K2 between two adjacent rows of the first pads 200 are equal.

The widths K3 in the second direction D2 of each of the first pads 200 in one column progressively decrease in the direction approaching the display region 00a, and the distances K4 between two adjacent first pads 200 in each of the rows progressively increase in the direction approaching the display region 00a, such that the distances between two adjacent columns of first pads 200 progressively increase along the direction approaching the display region 00a. In this way, it is ensured that the area of the positive projection of the first pads 200 closer to the display region 00a on the first substrate 100 is smaller. In this way, the excess film between the second pad 011 and the first pad 200 flows mainly in the region between the two adjacent columns of first pads 200 in the direction approaching the display region 00a. The region between the two columns of first pads 200 is a channel for the excess film to flow out from the binding region.

Figure 9:
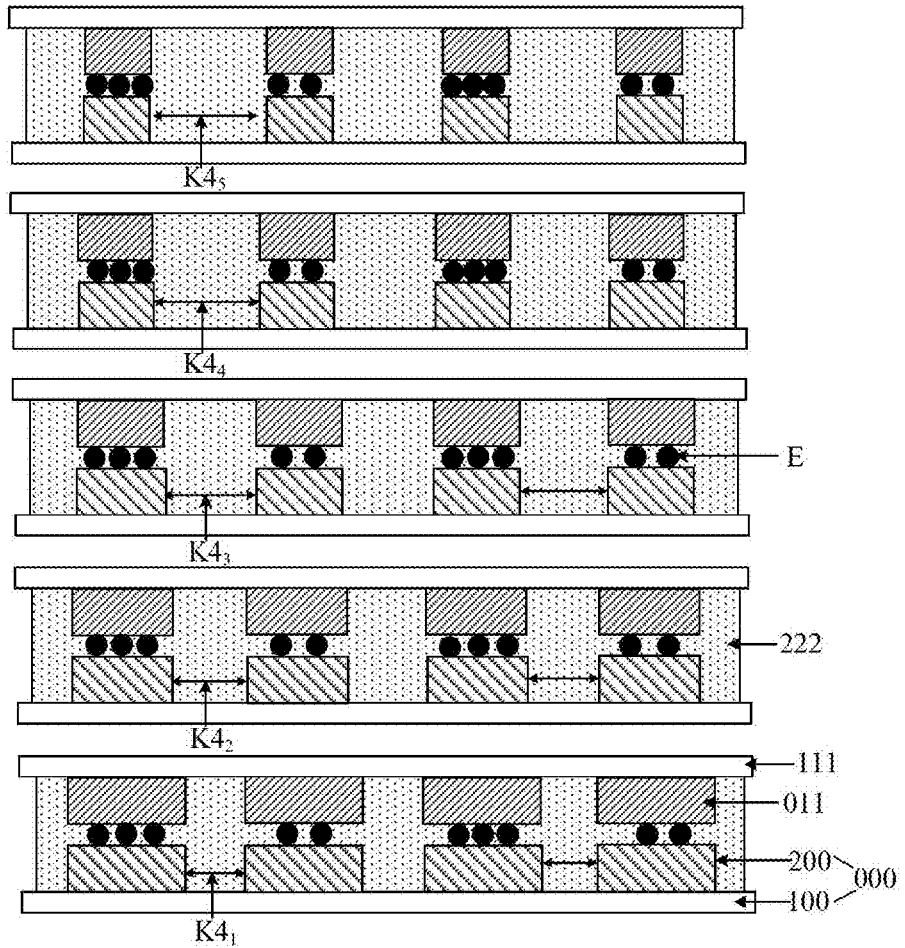
FIG. 9 is a schematic diagram of a cross-section of a plurality of rows of first pads bound to corresponding second pads illustrated in FIG. 8.

In this case, referring to FIG. 9, FIG. 9 is a schematic diagram of a cross-section of a plurality of rows of first pads bound to corresponding second pads illustrated in FIG. 8. It is assumed that the plurality of first pads 200 in FIG. 8 are arranged as 5 rows of first pads 200, the row of the first pad farthest from display region 00a is the first row of the first pad, and the row of the first pad closest to display region 00a is the fifth row of the first pad. Then, the distances between two adjacent first pads in the first row of the first pad are K4$_1$, the distances between two adjacent first pads in the second row of the first pad are K4$_2$, the distances between two adjacent first pads in the third row of the first pad are K4$_3$, the distances between two adjacent first pads in the fourth row of the first pad are K4$_4$, and the distances between two adjacent first pads in the fifth row of the first pad are K4$_5$. In this case, the values of K4$_1$, K4$_2$, K4$_3$, K4$_4$ and K4$_5$ are progressively increased, such that the width of the channel closer to the display area 00a for the film to flow out of the binding region is larger. In this way, during the process of binding the drive assembly 111 to the non-display region 00b of the display panel 000, the excess film of the ACF 222 between the second pads 011 and the first pads 200 is extruded into the region between the two adjacent columns of the first pad 200. Because the width of the channel closer to the display region 00a for the film to flow out of the binding region is larger, the excess film extruded into the region between the two adjacent columns of first pads 200 can flow out of the binding region faster in the direction closer to the display region 00a. It should be noted that FIG. 9 is illustrated schematically in the case that the arrangement and size of the plurality of second pads 011 of the drive assembly 111 are the same as the arrangement and size of the first pads 200. In other possible implementations, the size of each of the second pads 011 in the drive assembly 111 are identical, which is not limited in the embodiment of the application.

In the embodiment of the application, for two adjacent first pads 200 of the first pads 200 in one column, a width K3 in the second direction D2 of the first pad 200 closer to the display region 00a is 5% to 10% less than a width K3 in the second direction D2 of the other first pad 200.

For example, it is assumed that the row of the first pads farthest from the display region 00a is the first row of the first pad, and the row of the first pads closest to the display region 00a is the Nth row of the first pad. The widths of first pads in the first row of the first pad in the first direction D1 are K1t, and the widths of first pads in the Nth row of the first pad in the first direction D1 are K1$_N$. The distance between the first row of the first pad and the second row of the first pad is K2$_1$, and the distance between the N−1th row of the first pad and the Nth row of the first pad is K2$_{N-1}$. The widths of the first pads in the first row of the first pad in the second direction D2 are K3$_1$, and the widths of the first pads in the Nth row of the first pad in the second direction D2 are K3$_N$. The distances between two adjacent first pads in the first row of the first pad are K4$_1$, and the distances between two adjacent first pads in the Nth row of the first pad are K4$_N$.

Then, in the arrangement of the first pads shown in FIG. 8, the dimensions of each of the first pads satisfy the following relationship.

$$K1_1 = K1_2 = \ldots = K1_N;$$

$$K2_1 = K2_2 = \ldots = K2_{N-1};$$

$$K3_2 = K3_1 - K3_1(5\% \sim 10\%), \ldots, K3_N = K3_{N-1} - K3_{N-1}(5\% \sim 10\%);$$

$$K4_2 = K4_1 + K3_1(5\% \sim 10\%), \ldots, K4_N = K4_{N-1} + K3_{N-1}(5\% \sim 10\%).$$

Figure 10:
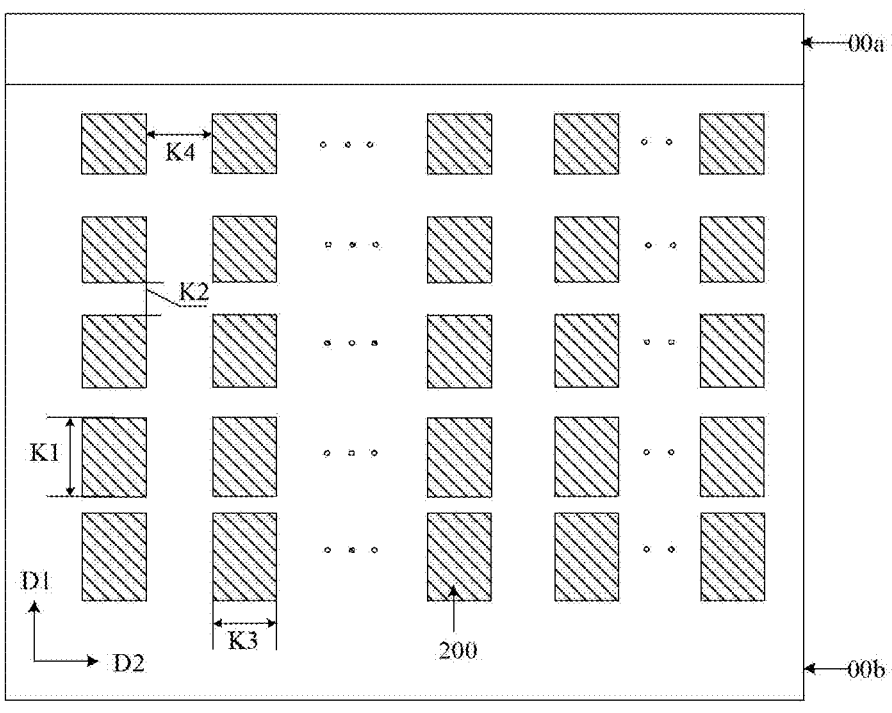
FIG. 10 is a schematic diagram of a second arrangement of first pads according to some embodiments of the present application.

In the second optional implementation, referring to FIG. 10, FIG. 10 is a schematic diagram of a second arrangement of first pads according to some embodiments of the present application. Widths K3 of the first pads 200 in different rows in the second direction D2 are equal, and the distances K4 between two adjacent first pads 200 in each of the rows are equal.

The widths K1 in the first direction of each of the firsts pad 200 in one column progressively decrease in the direction approaching the display region. The distances K2 between two adjacent rows of the first pads 200 progressively increase in the direction approaching the display region 00a. In this way, it is ensured that the area of the orthographic projection of the first pad 200 closer to the display region 00a on the first substrate 100 is smaller. In this way, the excess film between the second pads 011 and the first pads 200 flows mainly in the region between the two adjacent rows of first pads 200 in the second direction D2. The region between the two rows of first pads 200 is a channel for excess film to flow out of the binding region.

In this case, during the process of binding the drive assembly 111 to the non-display region 00b of the display panel 000, the excess film of the ACF 222 between the second pads 011 and the first pads 200 is extruded into the region between the first pads 200 of the two adjacent rows. Moreover, the width of the region between the first pads 200 of the two adjacent rows closer to the display region 00a is larger, that is, the width of the channel for the film to flow out of the binding region is larger. Therefore, the excess film extruded to the region between the first pads 200 of the two adjacent rows flows out of the binding region faster in the second direction D2 direction.

In some embodiment of the present application, for two adjacent first pads 200 of the first pads 200 in one column, the width K1 in the first direction D1 of the first pad 200 closer to the display region 00a is 5% to 10% less than the width K1 in the first direction D1 of the other first pad 200.

For example, it is assumed that the row of the first pads farthest from the display region 00a is the first row of the first pad, and the row of the first pads closest to the display region 00a is the Nth row of the first pad. The widths of first pads in the first row of the first pad in the first direction D1 are $K1_1$, and the widths of first pads in the Nth row of the first pad in the first direction D1 are $K1_N$. The distance between the first row of the first pad and the second row of the first pad is $K2_1$, and the distance between the N−1th row of the first pad and the Nth row of the first pad is $K2_{N-1}$. The widths of the first pads in the first row of the first pad in the second direction D2 are $K3_1$, and the widths of the first pads in the Nth row of the first pad in the second direction D2 are $K3_N$. The distances between two adjacent first pads in the first row of the first pad are $K4_1$, and the distances between two adjacent first pads in the Nth row of the first pad are $K4_N$.

Then, in the arrangement of the first pads shown in FIG. 10, the dimensions of each of the first pads satisfy the following relationship.

$$K1_2 = K1_1 - K1_1(5\% \sim 10\%), \ldots, K1_N = K1_{N-1} - K1_{N-1}(5\% \sim 10\%);$$

$$K2_2 = K2_1 + K1_1(5\% \sim 10\%), \ldots, K2_{N-1} = K2_{N-2} + K1_{N-1}(5\% \sim 10\%);$$

$$K3_1 = K3_2 = \ldots = K3_N;$$

$$K4_1 = K4_2 = \ldots = K4_N.$$

Figure 11:
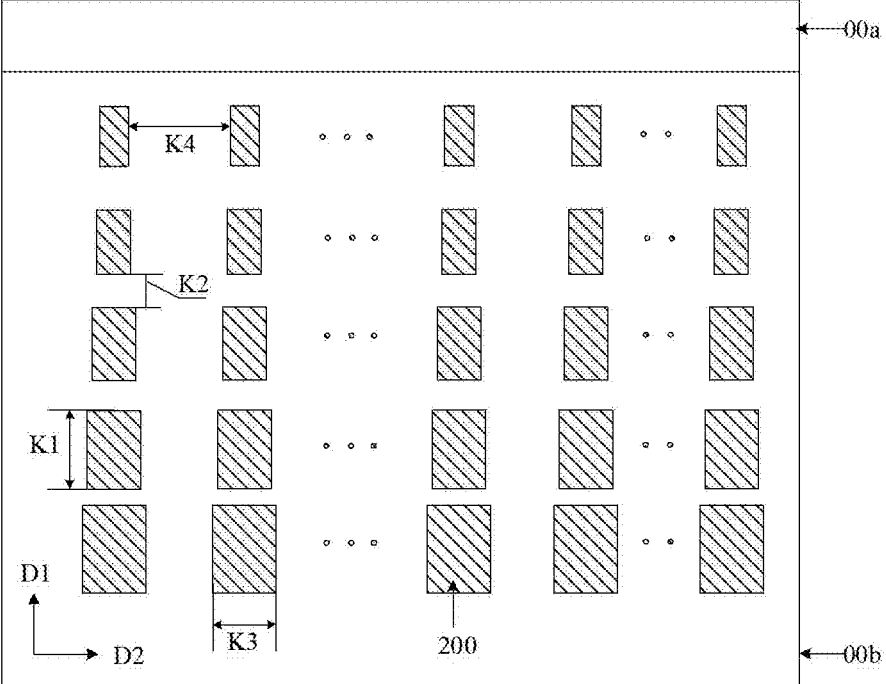
FIG. 11 is a schematic diagram of a third arrangement of first pads according to some embodiments of the present application.

In a third optional implementation, referring to FIG. 11, FIG. 11 is a schematic diagram of a third arrangement of first pads according to some embodiments of the present application. The widths K1 in the first direction D1 and widths K3 in the second direction D2 of each of the first pads 200 in one column progressively decrease in the direction approaching the display region 00a. The distances K4 between two adjacent first pads 200 in each of the rows progressively increase in the direction approaching the display region 00a, such that the distances between two adjacent columns of first pads 200 progressively increase along the direction approaching the display region 00a. The distances K2 between two adjacent rows of the first pads 200 progressively increase in the direction approaching the display region 00a. In this way, it is ensured that the area of the positive projection of the first pads 200 closer to the display region 00a on the first substrate 100 is smaller. In this way, the excess film between the second pad 011 and the first pad 200 is in the region between the two adjacent rows of first pads 200 and in the region between the two adjacent columns of first pads 200, and the excess film flows in the direction of the second direction D2 or in the direction towards the display region 00a. The region between the two rows of the first pads 200 is a channel for the excess film to flow out of the binding region, and the region between the two columns of the first pads 200 is also a channel for the excess film to flow from the binding region.

In this case, the distances between any two adjacent first pads 200 in a row of first pads 200 approaching the display region 00a are greater, the distances between any two adjacent first pads 200 in a column of first pads 200 are greater, that is, the width of the channel for the film to flow from the binding region is greater. During the process of binding the drive assembly 111 to the non-display region 00b of the display panel 000, the excess film of the ACF 222 between the second pads 011 and the first pads 200 is extruded into the region between the two adjacent rows of the first pads 200 and the region between the two adjacent columns of the first pads 200, such that a portion of the excess film flows in the direction D2 out of the binding region, and another portion of the excess film flows in the direction toward display region 00a out of the binding region.

In some embodiments of the present application, for two adjacent first pads 200 of the first pads in one column, the width K1 in the first direction D1 of the first pad 200 closer to the display region is 5% to 10% less than the width K1 in the first direction D2 of the other first pad 200. In addition, for two adjacent first pads 200 of the first pads 200 in one column, the width K3 in the second direction D2 of the first pad 200 closer to the display region 00a is 5% to 10% less than the width K3 in the second direction D2 of the other first pad 200.

For example, it is assumed that the row of the first pads farthest from the display region 00a is the first row of the first pad, and the row of the first pads closest to the display region 00a is the Nth row of the first pad. The widths of first pads in the first row of the first pad in the first direction D1 are $K1_1$, and the widths of first pads in the Nth row of the first pad in the first direction D1 are $K1_N$. The distance between the first row of the first pad and the second row of the first pad is $K2_1$, and the distance between the N−1th row of the first pad and the Nth row of the first pad is $K2_{N-1}$. The widths of the first pads in the first row of the first pad in the second direction D2 are $K3_1$, and the widths of the first pads in the Nth row of the first pad in the second direction D2 are $K3_N$. The distances between two adjacent first pads in the first row of the first pad are $K4_1$, and the distances between two adjacent first pads in the Nth row of the first pad are $K4_N$.

Then, in the arrangement of the first pads shown in FIG. 11, the dimensions of each of the first pads satisfy the following relationship.

$$K1_2 = K1_1 - K1_1(5\% \sim 10\%), \ldots , K1_N = K1_{N-1} - K1_{N-1}(5\% \sim 10\%);$$

$$K2_2 = K2_1 + K1_1(5\% \sim 10\%), \ldots , K2_{N-1} = K2_{N-2} + K1_{N-1}(5\% \sim 10\%);$$

$$K3_2 = K3_1 - K3_1(5\% \sim 10\%), \ldots , K3_N = K3_{N-1} - K3_{N-1}(5\% \sim 10\%);$$

$$K4_2 = K4_1 + K3_1(5\% \sim 10\%), \ldots , K4_N = K4_{N-1} + K3_{N-1}(5\% \sim 10\%).$$

In addition, in the case that any two adjacent first pads 200 in a row of first pads 200 near display region 00$a$ are closely arranged, the distance between the Nth row of the first pad closest to display region 00$a$ and the first row of the first pad farthest from display region 00$a$ is smaller, such that the length of the channel for the film to flow out of the binding region is reduced. In this way, the excess film in the region between the two adjacent rows of first pads 200 and the region between the two adjacent columns of first pads 200 are more likely to flow from the channel between the two adjacent columns of first pads 200 towards the display region 00$a$ to flow out of the binding region.

Figure 12:
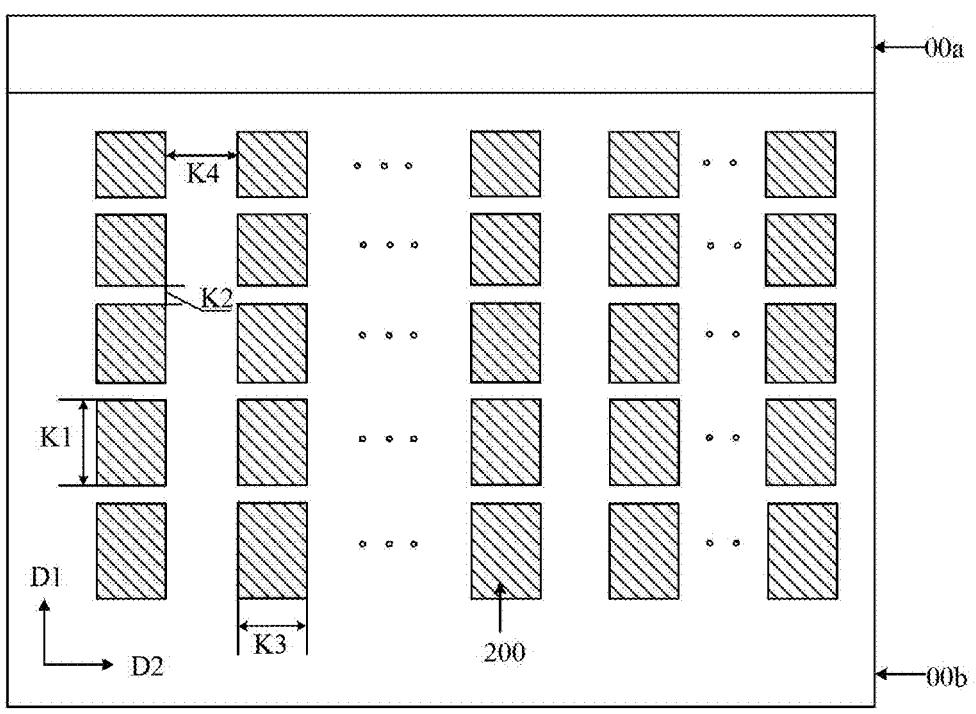
FIG. 12 is a schematic diagram of a fourth arrangement of first pads according to some embodiments of the present application.

In the fourth optional implementation, referring to FIG. 12, FIG. 12 is a schematic diagram of a fourth arrangement of first pads according to some embodiments of the present application. The widths K3 of the first pads 200 in different rows in the second direction D2 are equal, and the distances K4 between two adjacent first pads 200 in each of the rows are equal, and the distances K2 between two adjacent rows of the first pads 200 are equal.

The widths K1 in the first direction D1 of each of the firsts pad 200 in one column progressively decrease in the direction approaching the display region 00$a$. In this way, the distance between the first pad 200 of the row nearest to the display region 00$a$ and the first pad 200 of the row farthest from the display region 00$a$ in the binding region is smaller, that is, the length of the region between the two adjacent columns of the first pads 200 is shorter, and the length of the channel for the film to flow out of the binding region is shorter. In this way, the excess film between the second pads 011 and the first pads 200 flows mainly in the direction approaching the display region 00$a$ in the region between the two adjacent columns of the first pads 200. The region between the two columns of first pads 200 is a channel for the excess film to flow out of the binding region.

In this case, during the process of binding the drive assembly 111 to the non-display region 00$b$ of the display panel 000, the excess film of the ACF 222 between the second pads 011 and the first pads 200 is extruded into the region between the first pads 200 of the two adjacent rows. Moreover, because the length of the channel in the binding region for the film to flow out of the binding region is short, the excess film extruded into the region between the two adjacent columns of the first pads 200 has a shorter distance to flow in the direction approaching the display region 00$a$, making it easier for the excess film to flow out of the channel between the two adjacent columns of the first pads 200 in the direction approaching the display region 00$a$ into the binding region.

In some embodiments of the present application, for two adjacent first pads 200 of the first pads 200 in one column, the width K1 in the first direction d1 of the first pad 200 closer to the display region 00$a$ is 5% to 10% less than the width K1 in the first direction D1 of the other first pad 200.

For example, it is assumed that the row of the first pads farthest from the display region 00$a$ is the first row of the first pad, and the row of the first pads closest to the display region 00$a$ is the Nth row of the first pad. The widths of firsts pad in the first row of the first pad in the first direction D1 are $K1_1$, and the widths of first pads in the Nth row of the first pad in the first direction D1 are $K1_N$. The distance between the first row of the first pad and the second row of the first pad is $K2_1$, and the distance between the N−1th row of the first pad and the Nth row of the first pad is $K2_{N-1}$. The widths of the first pads in the first row of the first pad in the second direction D2 are $K3_1$, and the widths of the first pads in the Nth row of the first pad in the second direction D2 are $K3_N$. The distances between two adjacent first pads in the first row of the first pad are $K4_1$, and the distances between two adjacent first pads in the Nth row of the first pad are $K4_N$.

Then, in the arrangement of the first pads shown in FIG. 12, the dimensions of each of the first pads satisfy the following relationship.

$$K1_2 = K1_1 - K1_1(5\% \sim 10\%), \ldots , K1_N = K1_{N-1} - K1_{N-1}(5\% \sim 10\%);$$

$$K2_1 = K2_2 = \ldots = K2_{N-1};$$

$$K3_1 = K3_2 = \ldots = K3_N;$$

$$K4_1 = K4_2 = \ldots = K4_N.$$

Figure 13:
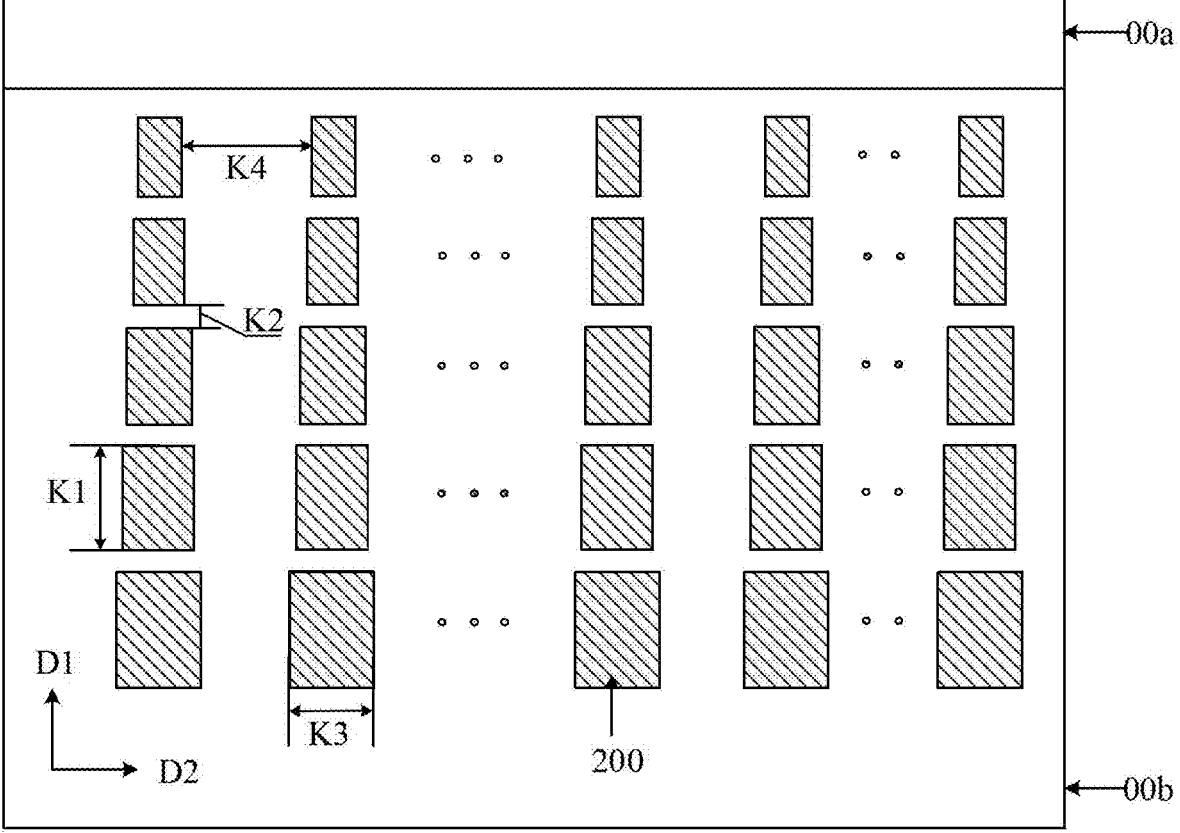
FIG. 13 is a schematic diagram of a fifth arrangement of first pads according to some embodiments of the present application.

In the fifth optional implementation, referring to FIG. 13, FIG. 13 is a schematic diagram of a fifth arrangement of first pads according to some embodiments of the present application. The distances K2 between the two adjacent rows of the first pads 200 are equal.

The widths K2 in the first direction D1 and widths K3 in the second direction D2 of each of the first pads 200 in one column progressively decrease in the direction approaching the display region 00$a$. The distances K4 between two adjacent first pads 200 in each of the rows progressively increase in the direction approaching the display region 00$a$. The area of the positive projection of each of the first pads 200 near the display region 00$a$ on the first substrate 100 progressively decrease, the distances between two adjacent columns of first pads 200 progressively increase, and the length of the region between two adjacent columns of first pads 200 within the binding region is shorter. In this way, the excess film between the second pads and the first pads 200 flows mainly in the direction approaching the display region 00$a$ in the region between the two adjacent columns of first pads 200. The region between the two columns of the first pads 200 is a channel for the excess film to flow out of the binding region.

In this case, during the process of binding the drive assembly 111 to the non-display region 00$b$ of the display panel 000, the excess film of the ACF 222 between the second pads 011 and the first pads 200 is extruded into the region between the first pads 200 of the two adjacent rows. Moreover, because the length of the channel in the binding region for allowing the film to flow out of the binding region is short and the distance between the two adjacent columns of first pads 200 near the display region 00$a$ is large, that is, the length of the channel for the film to flow out of the binding region is shorter and the width is larger. Therefore, the excess film extruded to the region between the two adjacent columns of first pads 200 flows more easily from the direction toward the display region 00*a*, and more excess film flows out of the binding region effectively, which improves the electrical connection between the second pads 011 and the first pads 200 in the binding region.

In some embodiments of the present application, for two adjacent first pads 200 of the first pads 200 in one column, the width K1 in the first direction d1 of the first pad 200 closer to the display region 00*a* is 5% to 10% less than the width K1 in the first direction D1 of the other first pad 200. In addition, for two adjacent first pads 200 of the first pads 200 in one column, the width K3 in the second direction D2 of the first pad 200 closer to the display region 00*a* is 5% to 10% less than the width K3 in the second direction D2 of the other first pad 200.

For example, it is assumed that the row of the first pads farthest from the display region 00*a* is the first row of the first pad, and the row of the first pads closest to the display region 00*a* is the Nth row of the first pad. The widths of first pads in the first row of the first pad in the first direction D1 are $K1_1$, and the widths of first pads in the Nth row of the first pad in the first direction D1 are $K1_N$. The distance between the first row of the first pad and the second row of the first pad is $K2_1$, and the distance between the N−1th row of the first pad and the Nth row of the first pad is $K2_{N-1}$. The widths of the first pads in the first row of the first pad in the second direction D2 are $K3_1$, and the widths of the first pads in the Nth row of the first pad in the second direction D2 are $K3_N$. The distances between two adjacent first pads in the first row of the first pad are $K4_1$, and the distances between two adjacent first pads in the Nth row of the first pad are $K4_N$.

Then, in the arrangement of the first pads shown in FIG. 11, the dimensions of each of the first pads satisfy the following relationship.

$$K1_2 = K1_1 - K1_1(5\% \sim 10\%), \ldots, K1_N = K1_{N-1} - K1_{N-1}(5\% \sim 10\%);$$

$$K2_2 = K2_2 = \ldots = K2_{N-1};$$

$$K3_2 = K3_1 - K3_1(5\% \sim 10\%), \ldots, K3_N = K3_{N-1} - K3_{N-1}(5\% \sim 10\%);$$

$$K4_2 = K4_1 + K3_1(5\% \sim 10\%), \ldots, K4_N = K4_{N-1} + K3_{N-1}(5\% \sim 10\%).$$

Figure 14:
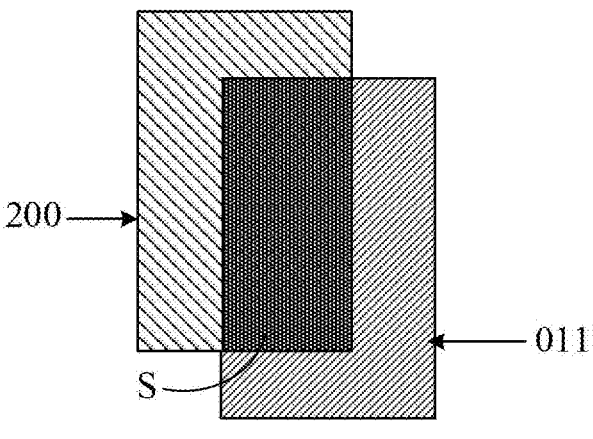
FIG. 14 is a schematic diagram of a first pad and a second pad according to some embodiments of the present application.

In the present application, for the several optional implementations described above, referring to FIG. 14, FIG. 14 is a schematic diagram of a first pad and a second pad according to some embodiments of the present application. In order to avoid the situation that the area of the positive projection of the first pad 200 on the first substrate 100 is too small, resulting in a poor electrical connection between the second pads and the first pads 200, in this application, it is necessary to ensure that the area of the positive projection of each first pad 200 on the first substrate 100 near the display region 00*a* is not too small. Exemplarily, the area of the orthographic projection of each of the first pads 200 in the row of first pads 200 closest to display region 00*a* on flexible substrate 100 needs to be greater than or equal to a predetermined area threshold. This preset area threshold is the minimum area of the orthographic projection of the second pad 011 on the flexible substrate 100 overlapped with the orthographic projection of the first pad 200 on the flexible substrate 100. In this way, a larger electrical connection area between the second pad and the first pad 200 is ensured, which results in a better electrical connection between the second pads 011 and the first pads 200. It should be noted that this preset area threshold is also related to the size of the area of effective bonding achieved by the ACF 222. Different types of ACF 222 correspond to different preset area thresholds.

Figure 15:
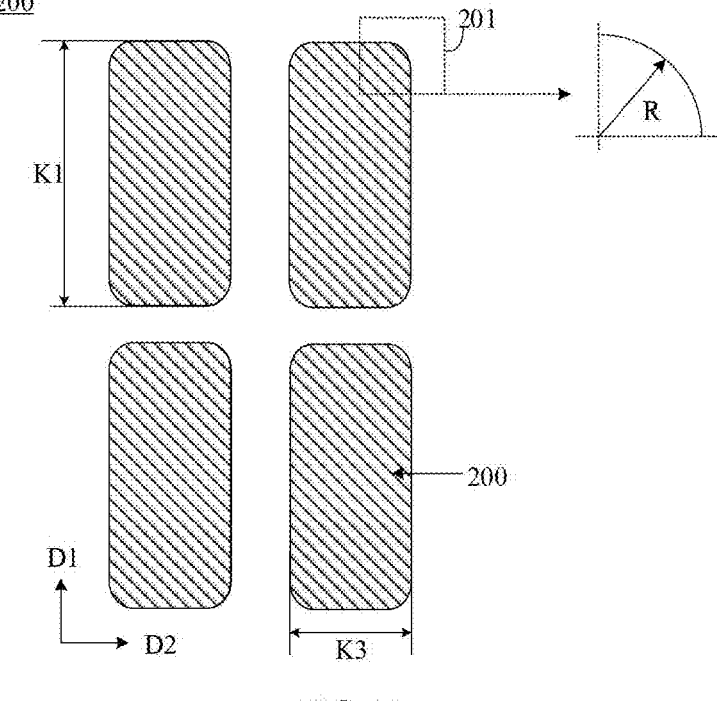
FIG. 15 is a top view of a first pad according to some embodiments of the present application.

In some embodiments of the present application, referring to FIG. 15, FIG. 15 is a top view of a first pad according to some embodiments of the present application. The first pad 200 has a plurality of corners 201, and the corners 201 include at least one of rounded corners and chamfered corners. For example, the shape of the orthographic projection of the first pad 200 on the substrate 100 is rectangular, the number of corners 201 in the first pad 200 is four, and the four corners 201 are arranged at the four top corners of the first pad 200.

In this case, for four first pads 200 of the plurality of first pads 200 arranged in two rows and two columns, by arranging the corners 201 of these four first pads 200 to be at least one of rounded corners and chamfered corners, the excess film between the two first pads 200 can be more easily directed into a channel for the excess film to flow.

Because the corner 201 of the first pad 200 includes at least one of a rounded corner and a chamfered corner, the embodiment of the present application is described in the following three cases.

In the first case, as shown in FIG. 15, in response to the corner portion 202 being the rounded corner, the radius R of the rounded corner ranges from 10% to 50% of the width K1 of the first pad 200 in the first direction D1.

Figure 16:
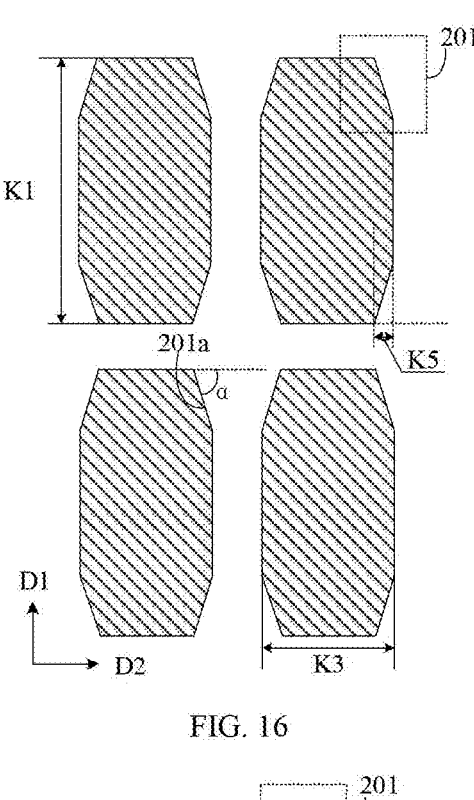
FIG. 16 is a top view of another first pad according to some embodiments of the present application.

In the second case, as shown in FIG. 16, FIG. 16 is a top view of another first pad according to some embodiments of the present application. In response to the corner portion 202 being the chamfered corner, an angle α between a bevel 201*a* of the chamfered corner and the second direction D2 ranges from 15° to 45°, and a width K5 in the second direction D2 of the chamfered corner ranges from 10% to 20% of the width K3 in the second direction D2 of the first pad 200.

Figure 17:
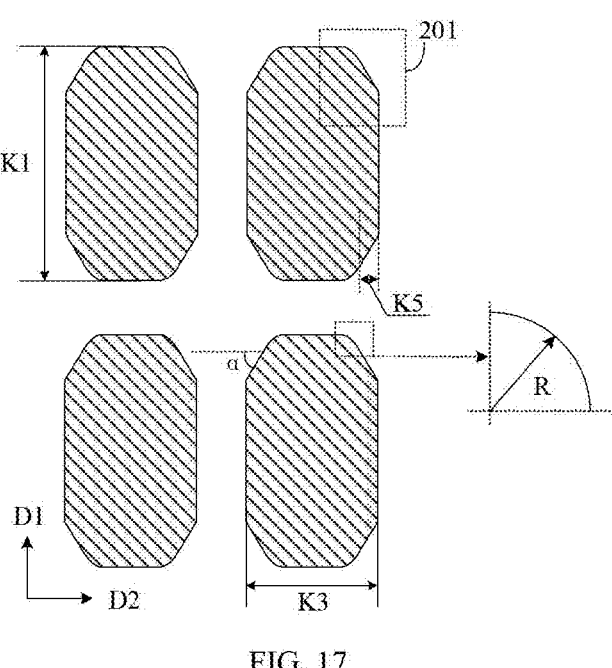
FIG. 17 is a top view of still another first pad according to some embodiments of the present application.

In the third case, as shown in FIG. 17, FIG. 17 is a top view of still another first pad according to some embodiments of the present application. In response to the corners 201 including the rounded corner and the chamfered corner, the angle α between the bevel 201*a* of the chamfered corner and the second direction D2 ranges from 15° to 45°, and the width K5 in the second direction D2 of the chamfered corner ranges from 10% to 20% of the width K3 in the second direction D2 of the first pad2 200.

The radius R of the rounded corner ranges from 10% to 50% of a target width. The target width is a difference between the width K3 in the second direction D2 of the first pad 200 and the width K5 in the second direction D2 of the two chamfered corners.

It should be noted that for the first optional implementation described above, as shown in FIG. 8 and FIG. 9, in the case that the widths K1 of the first pads 200 in different rows in the first direction D1 are equal and the corners of the first pads 200 have rounded corners, the radius R of the rounded corners of the first pads 200 progressively decreases along the direction approaching the display region 00*a*. Exemplarily, the radius R of the rounded corners of each first pad 200 in the first row of first pads is 10% of the width K1 of the first pad 200 in the first direction D1. The radius R of the rounded corners of each first pad 200 in the first pad in the second row of first pads is 20% of the width K1 of the first pad 200 in the first direction D1. The radius R of the rounded corners of each of the first pads 200 in the third row of first pads is 30% of the width K1 of the first pad 200 in the first direction D1. The radius R of the rounded corners of each of the first pads 200 in the fourth row of the first pads is 40% of the width K1 of the first pad 200 in the first direction D1. The radius R of the rounded corners of each of the first pads 200 in the fifth row of the first pads is 50% of the width K1 of the first pad 200 in the first direction D1. In this way, the excess film between the two first pads 200 closer to the display region 00a is more easily directed into the channel for the excess film to flow.

In the second optional implementation to the fifth optional implementation described above, the width K1 in the first direction D1 of each of the first pads 200 in one column of first pads 200 progressively decrease in the direction approaching the display region 00a. In the case that the corners of the first pads 200 include rounded corners, the radius R of the rounded corners of the first pads 200 is related to the width K1 of the first pads 200 in the first direction D1. Therefore, the radius R of the rounded corners of the first pad 200 progressively decrease in the direction approaching the display region 00a.

In the embodiment of the present application, the plurality of first pads 200 in the display panel 000 are arrayed in at least four rows. The quantity of rows of the plurality of first pads 200 is determined based on the quantity of signal lines in the display panel 000. The more signal lines the display panel 000 has, the more rows of the first pads 200 are arranged.

Figure 18:
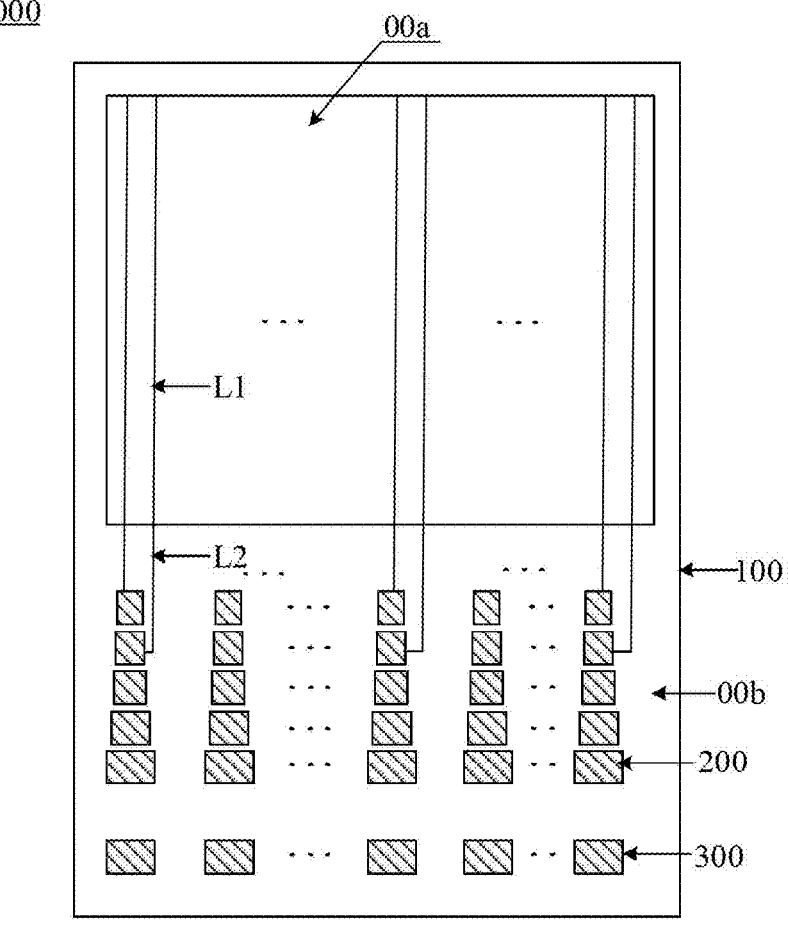
FIG. 18 is a top view of a display panel according to some embodiments of the present application.

In the embodiment of the present application, referring to FIG. 18, FIG. 18 is a top view of a display panel according to some embodiments of the present application. The display panel 000 includes: a plurality of signal lines L1 disposed within the display region 00a, and a plurality of fan-out lines L2 disposed within the non-display region 00b.

T plurality of light-emitting elements are arranged in a plurality of columns, a column of light emitting elements is electrically connected to the same signal line L1, the plurality of signal lines L1 is one to one electrically connected to a plurality of fan-out lines L2, and the plurality of fan-out lines L2 is electrically connected to a plurality of first pads 200 one by one. In this way, the signal line L1 can apply electrical signals to the plurality of light emitting elements in the display panel 000 to cause the light emitting elements to emit light. One end of the fan-out line L2 is electrically connected to the signal line L1, and the other end of the fan-out line L2 is electrically connected to the drive assembly 111 through the first pad 200. In this way, the electrical signals of the drive assembly III are applied to the plurality of light emitting elements in the display panel 000 through the fan-out line L2 and the signal line L1 to enable the display panel 000 to display the screen.

It should be noted that in other possible implementations, the first pad 200 also corresponds to at least two fan-out lines L2. In this case, the first pad 200 electrically connected to the plurality of two fan-out lines L2 needs to be electrically connected to a multiplexer. In this way, the display panel 000 can, through the multiplexer, drive the plurality of two fan-out leads L2 electrically connected to the first pad 200 in a time-sharing manner to cause the light emitting elements in the display panel 000 to emit light.

The display panel provided by the embodiments of present application includes: a first substrate, light emitting elements and first pads. The areas of orthographic projections of the rows of the first pads on the first substrate progressively decrease in a direction approaching the display region, such that the distance between any two adjacent first pads in a row closer to the display region is larger, and/or, the distance between the row of the first closest to the display region and the roe of the first pads farthest from the display region is smaller. In the case that the excess film of the ACF between the second pads and the first pads is extruded in the process of binding the drive assembly to the display panel through the ACF, the excess film flows in the direction closer to the display region. In this way, in the case that the distance between any two adjacent first pads in a row arranged closer to the display region is greater, the excess film extruded from the ACF between the first pads and the second pads flows faster in the direction closer to the display region. Similarly, in the case that the distance between the row of the first pad closest to the display region and the row of the first pad farthest from the display region is smaller, the distance that the excess film of the ACF extruded from the first pad and the second pad flows in the direction closer to the display region is smaller, such that excess film can flow out of the binding region faster. In this way, the excess film between the second pads and the first pads does not accumulate in the binding region, such that the conductive particles between the second pads and the first pads are in close contact with the second pads and the first pads respectively, which makes the electrical connection between the second pads and the first pads better and effectively improves the display effect of the display panel.

Figures 19, 20:
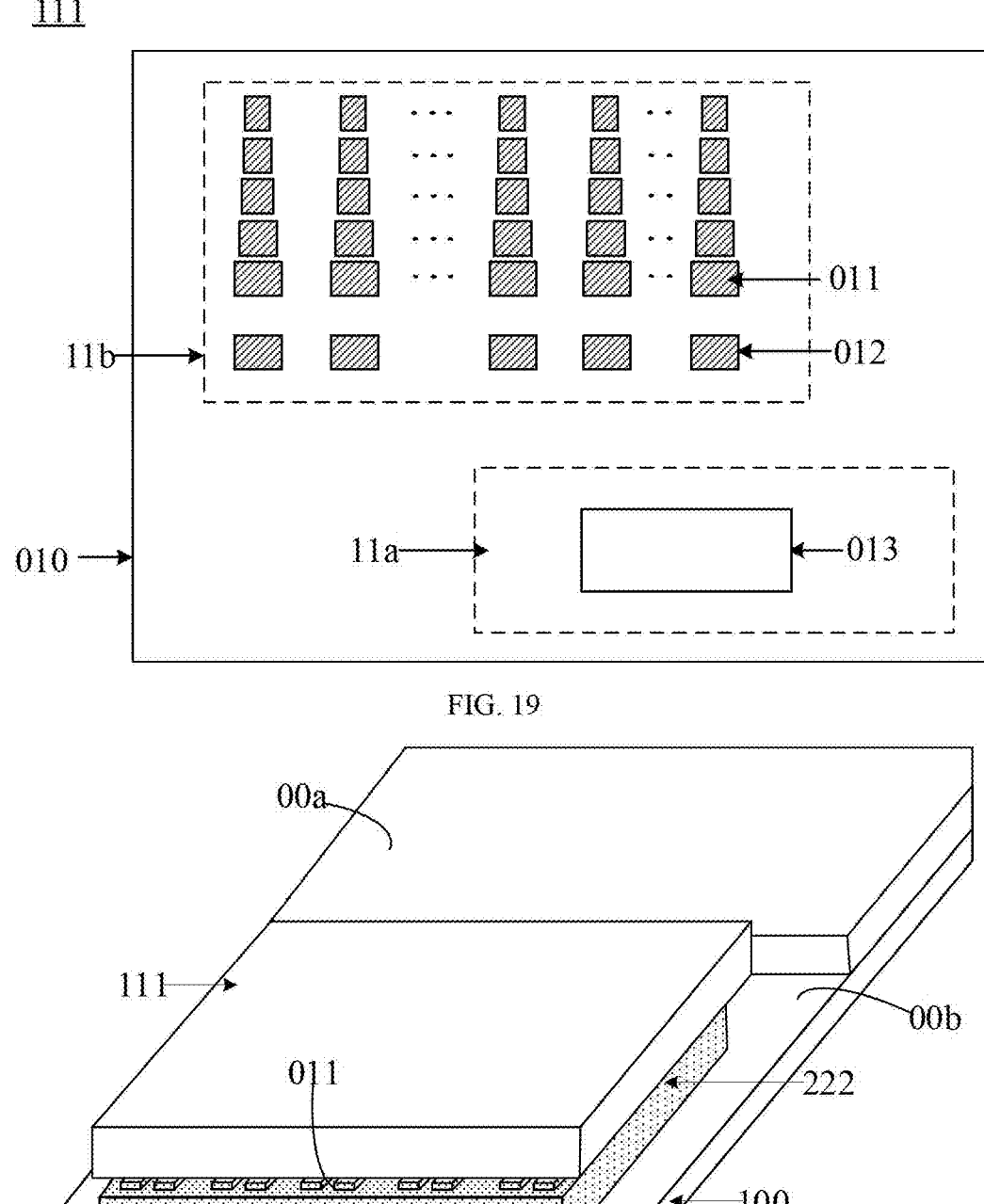
FIG. 19 is a top view of a drive assembly according to some embodiments of the present application.
FIG. 20 is a schematic diagram of a display device according to some embodiments of the present application.

Embodiments of the present application also provide a drive assembly, referring to FIG. 19, FIG. 19 is a top view of a drive assembly according to some embodiments of the present application. The drive assembly 111 has a member region 11a and a connection region 11b disposed on one side of the member region 11a. The drive assembly 111 includes: a second substrate 010, a driver chip 013 disposed within the member region 11a, and a plurality of second pads 011 disposed within the connection region 11b.

The plurality of second pads 011 are configured to be electrically connected to the driver chip 013 and electrically connected to a display panel 000, the plurality of second pads 011 are arrayed in a plurality of rows, and the plurality of rows of the second pads 011 are sequentially arranged along a direction departing from the member region 11a. In this way, the driver chip 013 in the drive assembly 111 can apply an electrical signal to the fan-out line L2 electrically connected thereto through the second pad 011, and then the fan-out line L2 can apply the electrical signal to the plurality of light emitting elements in the display panel 000 through the signal line L1.

The areas of orthographic projections of the rows of the second pads 011 on the second substrate 010 progressively decrease in a direction departing from the member region 11a.

In the embodiments of the present application, the drive assembly 111 further includes a third pad 012 disposed on the second substrate 010 corresponding to a plurality of electrical pads 300, such that the electrical pads 300 in the display panel 000 are electrically connected to the third pads 012 in the drive assembly 111 by ACF 222, and the members in the drive assembly 111 are electrically connected.

It should be noted that the plurality of second pads 011 are one to one corresponding to the plurality of first pads 200. Therefore, the arrangement of the plurality of second pads 011 in the drive assembly 111 and the size of each of the second pads 011 are referred to the corresponding part in the above described embodiment regarding the structure description of the display panel, which is not repeated in the embodiment of the present application.

Embodiments of the present application further provide a method for manufacturing a display panel. The method for manufacturing the display panel is configured to manufacture the display panel described in the above embodiments. The method for manufacturing the display panel includes:

forming a plurality of light emitting elements and a plurality of first pads on a first substrate.

wherein the display panel has a display region and a non-display region disposed outside the display region, the plurality of light emitting elements are disposed within the display region, and the plurality of first pads are disposed within the non-display region.

The plurality of first pads are configured to be electrically connected to a plurality of light emitting elements and electrically connected to the drive assembly, and the plurality of first pads are arranged in a plurality of rows, and the plurality of first pads are sequentially arranged along the direction departing from the display region.

The area of the positive projection of each row of first pads on the first substrate decreases in the direction approaching the display region.

A person skilled in the art can clearly understand that, for the convenience and conciseness of description, the specific principle of the display panel described above can be referred to the corresponding content in the aforementioned embodiment of the display panel structure, which is not be repeated here.

Embodiments of the present application further provide a display device. Referring to FIG. 20, FIG. 20 is a schematic diagram of a display device according to some embodiments of the present application. The display device can be: cell phone, tablet PC, TV, monitor, laptop, digital photo frame, navigator and any other products or components having display function. The display device includes: the display panel 000 of any of the above and the drive assembly, the driver assembly is a flexible circuit board, or a separate driver chip. In the case that the driver assembly is a flexible circuit board, the driver chip is integrated in the flexible circuit board, and a plurality of first pads 200 in the display panel 000 are one to one electrically connected to a plurality of second pads 011 in the flexible circuit board 111. In the case that the drive assembly is a driver chip, the driver chip has a second pad 011 that is one to one electrically connected to a plurality of first pads 200.

In some embodiments of the present application, the display device further includes an ACF 222 disposed between the display panel 000 and the drive assembly 111. The ACF 222 causes the display panel 000 to be electrically connected to the drive assembly 111.

In the application, the display panel may be an OLED display panel or an Active Matrix-Organic Light Emitting Diode (AM-OLED) display panel.

It should be noted that in the accompanying drawings, the dimensions of the layers and regions may be exaggerated for the clarity of the illustrations. It is understood that when a component or layer is referred to as being "on" another component or layer, it may be directly over the other component, or there may be an intermediate layer. It is understood that when an element or layer is referred to as being "under" another element or layer, it may be directly under other elements, or there may be more than one intermediate layer or element. It is also understood that when a layer or element is referred to as being "between" two layers or elements, it may be the only layer between two layers or elements, or there may be more than one intermediate layer or element. Similar reference marks throughout indicate similar components.

In the application, the terms "first" and "second" are used for descriptive purposes only, and are not to be construed as indicating or implying relative importance. The term "plurality" refers to two or more, unless otherwise expressly limited.

A person of ordinary skill in the art may understand that all or some of the steps to achieve the above embodiments may be accomplished by hardware, or by a program that instructs the relevant hardware to do so, and that the program may be stored in a computer-readable storage medium, and that the storage medium may be read-only memory, disk or CD-ROM, etc.

The above mentioned are only optional embodiments of the present application and are not used to limit the present application. Any modification, equivalent replacement, improvement, etc. made within the spirit and principles of the present application shall be included in the scope of protection of the present application.

What is claimed is:

1. A display panel, having a display region and a non-display region disposed outside the display region, and comprising:

a first substrate;

a plurality of light emitting elements disposed within the display region; and a plurality of first pads disposed within the non-display region, wherein the plurality of first pads are configured to be electrically connected to the plurality of light emitting elements and electrically connected to a driver assembly, the plurality of first pads are arrayed in a plurality of rows, and the plurality of rows of the first pads are sequentially arranged along a direction departing from the display region;

wherein areas of orthographic projections of the rows of the first pads on the first substrate progressively decrease in a direction approaching the display region; and wherein the plurality of first pads are arrayed in the plurality of rows in a first direction and in a plurality of columns in a second direction, the first direction is a column direction and the second direction is a row direction, and distances in the first direction between two adjacent rows of the first pads progressively increase in the direction approaching the display region.

2. The display panel according to claim 1, wherein at least one of widths in the first direction or in the second direction of the first pads in one column progressively decrease in a direction approaching the display region.

3. The display panel according to claim 2, wherein widths of the first pads in different rows in the first direction are equal; and widths in the second direction of the first pads in one column progressively decrease in the direction approaching the display region, and distances between two adjacent first pads in each of the rows progressively increase in the direction approaching the display region.

4. The display panel according to claim 3, wherein for two adjacent first pads of the first pads in one column, a width in the second direction of the first pad closer to the display region is 5% to 10% less than a width in the second direction of the other first pad.

5. The display panel according to claim 2, wherein widths of the first pads in different rows in the second direction are equal, and distances between two adjacent first pads in each of the rows are equal; and

widths in the first direction of the first pads in one column progressively decrease in the direction approaching the display region.

6. The display panel according to claim 5, wherein for two adjacent first pads of the first pads in one column, a width in the first direction of the first pad closer to the display region is 5% to 10% less than a width in the first direction of the other first pad.

7. The display panel according to claim 2, wherein widths in the first direction and widths in the second direction of each of the first pads in one column progressively decrease in the direction approaching the display region, distances between two adjacent first pads in each of the rows progressively increase in the direction approaching the display region.

8. The display panel according to claim 2, wherein the first pad has a plurality of corners, the corners comprising at least one of rounded corners and chamfered corners.

9. The display panel according to claim 8, wherein in response the corner being the rounded corner, a radius of the rounded corner ranges from 10% to 50% of a width of the first pad in the first direction.

10. The display panel according to claim 8, wherein in response the corner being the chamfered corner, an angle between a bevel of the chamfered corner and the second direction ranges from 15° to 45°, and a width in the second direction of the chamfered corner ranges from 10% to 20% of the width in the second direction of the first pad.

11. The display panel according to claim 8, wherein
in response to the corners comprising the rounded corner and the chamfered corner, an angle between a bevel of the chamfered corner and the second direction ranges from 15° to 45°, and a width in the second direction of the chamfered corner ranges from 10% to 20% of a width in the second direction of the first pad; and
a radius of the rounded corner ranges from 10% to 50% of a target width, the target width being a difference between the width in the second direction of the first pad and a width in the second direction of the two chamfered corners.

12. The display panel according to claim 1, wherein the plurality of first pads are arrayed in at least 4 rows.

13. The display panel according to claim 1, wherein the areas of orthographic projections of the first pads in one row on the first substrate are equal, and distances between two adjacent first pads in one row are equal.

14. A drive assembly, having a member region and a connection region disposed on one side of the member region, and comprising:
a second substrate;
a driver chip disposed within the member region;
a plurality of second pads within the connection region, wherein the plurality of second pads are configured to be electrically connected to the driver chip and electrically connected to a display panel, the plurality of second pads are arrayed in a plurality of rows, and the plurality of rows of the second pads are sequentially arranged along a direction departing from the member region;
wherein areas of orthographic projections of the rows of the second pads on the second substrate progressively decrease in a direction departing from the member region; and

wherein the plurality of second pads are arrayed in the plurality of rows in a first direction and in a plurality of columns in a second direction, the first direction is a column direction and the second direction is a row direction, and distances in the first direction between two adjacent rows of the second pads progressively increase in the direction approaching the display region.

15. A display device, comprising: a display panel and a drive assembly, wherein the display panel has a display region and a non-display region disposed outside the display region and comprises:
a first substrate;
a plurality of light emitting elements disposed within the display region; and
a plurality of first pads disposed within the non-display region, wherein the plurality of first pads are configured to be electrically connected to the plurality of light emitting elements and electrically connected to a driver assembly, the plurality of first pads are arrayed in a plurality of rows, and the plurality of rows of the first pads are sequentially arranged along a direction departing from the display region;
wherein areas of orthographic projections of the rows of the first pads on the first substrate progressively decrease in a direction approaching the display region;
wherein the plurality of first pads in the display panel are one to one electrically connected to a plurality of second pads in the drive assembly; and
wherein the plurality of first pads are arrayed in the plurality of rows in a first direction and in a plurality of columns in a second direction, the first direction is a column direction and the second direction is a row direction, and distances in the first direction between two adjacent rows of the first pads progressively increase in the direction approaching the display region.

16. The display device according to claim 15,
wherein at least one of widths in the first direction or in the second direction of the first pads in one column progressively decrease in a direction approaching the display region.

17. The display device according to claim 16, wherein
widths of the first pads in different rows in the first direction are equal; and
widths in the second direction of the first pads in one column progressively decrease in the direction approaching the display region, and distances between two adjacent first pads in each of the rows progressively increase in the direction approaching the display region.

18. The display device according to claim 16, wherein widths of the first pads in different rows in the second direction are equal, and distances between two adjacent first pads in each of the rows are equal; and
widths in the first direction of the first pads in one column progressively decrease in the direction approaching the display region.

* * * * *